(12) United States Patent
Jou

(10) Patent No.: US 6,201,289 B1
(45) Date of Patent: Mar. 13, 2001

(54) METHOD OF MANUFACTURING AN INDUCTOR

(75) Inventor: Chewnpu Jou, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/375,672

(22) Filed: Aug. 17, 1999

(51) Int. Cl.⁷ .............................. H01L 21/00; H01L 29/00
(52) U.S. Cl. ..................... 257/531; 438/957; 257/531; 333/184
(58) Field of Search ................... 257/531; 333/184; 438/407, 382, 957

(56) References Cited

U.S. PATENT DOCUMENTS

| | | | |
|---|---|---|---|
| 5,497,028 | * | 3/1996 | Ikeda et al. ............... 257/531 |
| 5,500,552 | * | 3/1996 | Ikeda et al. ............... 257/531 |
| 5,557,138 | * | 9/1996 | Ikeda et al. ............... 257/531 |
| 5,705,963 | * | 1/1998 | Ikeda et al. ............... 333/184 |

FOREIGN PATENT DOCUMENTS 2-72660 * 3/1990 (JP) .

* cited by examiner

*Primary Examiner*—Mahshid Saadat
*Assistant Examiner*—José R Díaz
(74) *Attorney, Agent, or Firm*—Thomas, Kayden, Horstemeyer & Risley

(57) ABSTRACT

A method for manufacturing an inductor. A silicon substrate of a first conductive type is provided. A spiral conductive layer is formed over the silicon substrate. A doped region of a second conductive type is formed in the substrate below the spiral conductive layer. A doped region of the first conductive type is next formed in the substrate around the doped region of the second conductive type. A reverse-bias voltage is applied to the doped region of the first conductive type and the doped region of the second conductive type. The application of a reverse-bias voltage creates a depletion region beneath the doped region of the second conductive type and the space between the doped regions.

10 Claims, 2 Drawing Sheets

METHOD OF MANUFACTURING AN INDUCTOR

BACKGROUND OF THE INVENTION

1. Field of Invention

The present invention relates to a method of manufacturing an inductor. More particularly, the present invention relates to a method of manufacturing a radio frequency (RF) semiconductor inductor with less substrate loss.

2. Description of Related Art

In general, an inductor is formed over a lossless substrate such as gallium arsenic substrate or a sapphire substrate which has a promising insulation effect to result in a low induced substrate current. Therefore, a high quality of the inductor can be obtained to enable an operation under a radio frequency (RF). However, since gallium arsenic substrate or sapphire crystal is expensive, a silicon substrate is typically used to reduce the cost. Using silicon technology to fabricate the inductor on a silicon substrate, though achieve a low cost fabrication, results in a higher consumption of energy. At present, methods to overcome the problem of high energy consumption by using silicon substrate have been developed. For example, the application of local substrate removal or slotted ground plane has been disclosed. However, these methods are not very practical and the effect is restricted.

SUMMARY OF THE INVENTION

The present invention provides an inductor formed on a silicon substrate that can effectively reduce induced current in the substrate, thereby reducing substrate loss.

In addition, the invention provides an inductor that has a higher inductance and a lower resistance. In addition, the parasitic capacitance of the inductor can be minimized value while the resonance oscillation frequency of the inductor can be raised to an optimum value.

To achieve these and other advantages and in accordance with the purpose of the invention, as embodied and broadly described herein, the invention provides a method for manufacturing a semiconductor inductor. A silicon substrate of a first conductive type is provided. A spiral conductive layer is formed over the silicon substrate. The spiral conductive layer has multiple spiral turns with a terminal at each end. One end of the spiral conductive layer is connected to an input terminal while the other end is connected to an output terminal. The spiral conductive layer can be made of aluminum or copper. A doped region of a second conductive type is formed in the substrate under the substrate surface. A doped region of the first conductive type is next formed in the substrate surrounding the doped region of the second conductive type. The doped region of the first conductive type is separated from the doped region of the second conductive type with a space without directly in contact. A reverse bias is provided to electrically connect the doped region of the first conductive type and the doped region of the second conductive type. A depletion region is thus formed between the doped regions of the first and the second conductive types. A top view of the dope region of the second conductive region has a sheet shape, while the doped region of the first conductive type has a ring shape surrounding the doped region of the second conductive type.

The invention also provides a method of manufacturing an inductor. A silicon substrate of a first conductive type is provided. A spiral conductive layer is formed on the silicon substrate. The spiral conductive layer has multiple spiral turns with a terminal at each end. One end of the spiral conductive layer is connected to an input terminal while the other end is connected to an output terminal. The spiral conductive layer can be made of aluminum or copper. A doped layer of the first conductive type is formed in the substrate under the spiral conductive layer. Concentration of dopants in the doped layer is higher than the concentration in the silicon substrate. The doped layer preferably has a depth of a few micrometers ($\mu$m) and a dopant concentration of about $5 \times 10^{19}$ atoms/cm$^3$.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
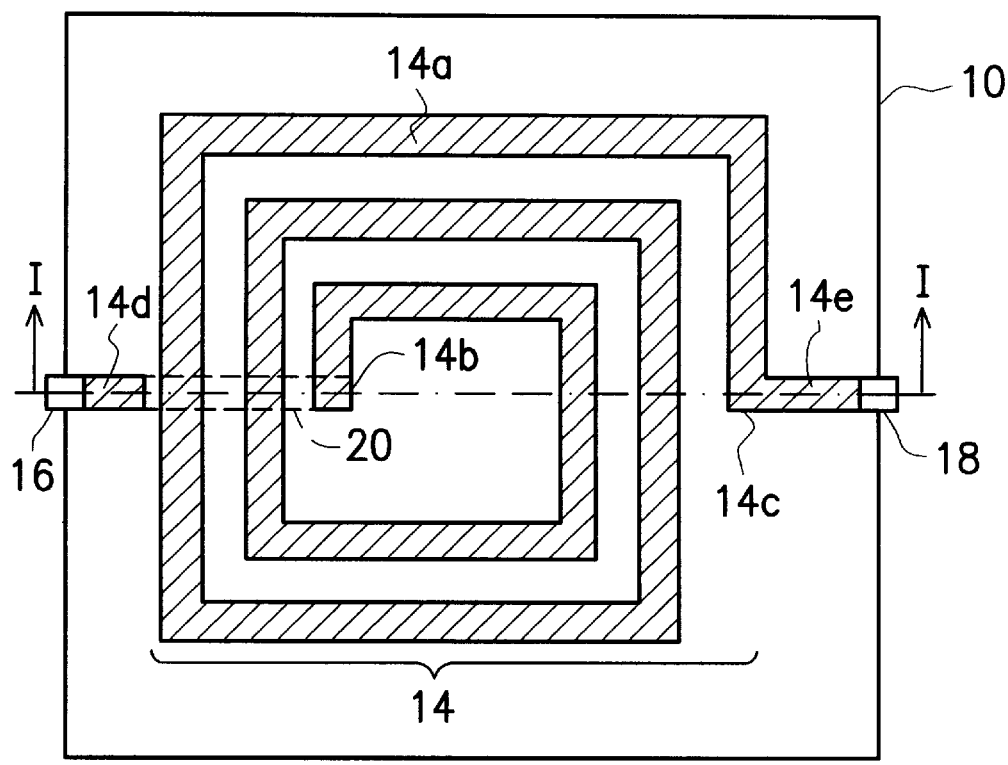
FIG. 1A is a schematic, top view showing an inductor according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
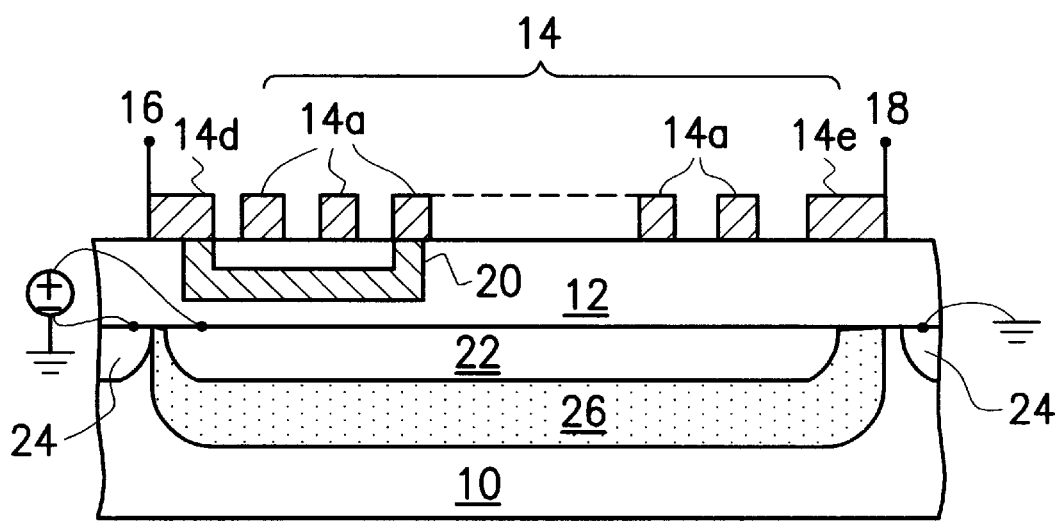
FIG. 1B is a schematic, cross-sectional view along line I—I in FIG. 1A.

FIG. 1A is a schematic, top view showing an inductor according to a first embodiment of this invention. FIG. 1B is a schematic, cross-sectional view along line I—I in FIG. 1A. As shown in FIGS. 1A and 1B, a substrate 10 such as a p-type or an n-type silicon substrate is provided. An insulation layer 12, preferably a silicon dioxide layer (SiO$_2$), is formed on the substrate 10. A spiral conductive layer 14, made of aluminum or copper material, is formed on the insulation layer 12. The spiral conductive layer 14 further includes a multiple spiral turns forming a spiral structure 14a having a first end 14b and a second end 14c. The first end 14b of the spiral structure 14a is connected to an input terminal 16 via a lower conductive layer 20 and a lead part 14d. The second end 14c is connected to an output terminal 18 via another lead part 14e. Alternatively, the first end 14b is connected to the output terminal 18 via the lower conductive layer 20 and the lead part 14d, and the first end 14c is connected to the input terminal 16 via the lead part 14e. The lower conductive layer 20 is formed within the insulation layer 12.

As shown in FIG. 1B, an implanted or doped region 22 is formed in the silicon substrate 10 in a surface region. Conductive type of the doped region 22 is opposite to that of the silicon substrate 10. For example, the doped region 22 can be a $N^+$ doped region while a P-type substrate 10 is in use or a $P^+$ doped region while an N-type substrate 10 is in used. A second doped region 24 having the same conductive type as the silicon substrate 10 such as a $P^+$ doped region or an $N^+$ doped region is formed in the substrate 10 surrounding the first doped region 22 under the exposed substrate surface. As denoted, the doping concentration of the first and the second doped regions 22 and 24 is higher than that of the silicon substrate 10. In addition, the second doped region 24 is separated from the first doped region 22 with a space. When viewed from the top, the first doped region 22 forms a sheet-like structure while the second doped region 24 forms a ring-like structure surrounding the first doped region 22. A reverse bias Vs is applied between the first doped region 22 and the second doped region 24. For example, a positive voltage is applied to the first doped region 22 and a negative voltage is applied to the second doped region 24. Or alternatively, the second doped region 24 is grounded as shown in FIG. 1B. The application of a reverse bias creates a depletion region 26 beneath the first doped region 22 and in the space between the doped regions 22 and 24. The portion of the depletion 26 under the first doped region 22 has a depth preferably between 0.5 to 18 μm. The depletion region 26 is of special importance in this invention because the depletion region 26 is an effective layer for shielding the spiral inductor 14 from the silicon substrate 10. Hence, induced current in the silicon substrate 10 is reduced and a smaller amount of energy is consumed.

Tables 1 to 4 are the results of simulating the inductor fabricated according to the first embodiment of this invention. The results are obtained using three-dimensional electromagnetic simulation software written by a U.S. company SONNET EM Corporation. The inductor is subjected to a range of operating frequencies with the depletion region 26 reaching a range of depths. Values of the resultant effective resistance Reff are also tabulated inside the tables. A smaller effective resistance Reff means that loss due to inductance inside the substrate is smaller and performance of the inductor is higher. It can be easily noted from the tables 1 to 4 that the thicker the depletion region 26, the smaller will be the value of the effective resistance Reff.

TABLE 1

Values of the effective resistance for a 0.15 nH inductor operating under various frequencies and depletion layer depths, wherein the spiral conductive layer of the inductor is made from an ideal lossless metal.
0.15 nH Inductor
An Ideal Metal

| Frequency (GHz) | Depth of Depletion Region (μm) | | | |
|---|---|---|---|---|
| | 0 | 6 | 12 | 18 |
| 0.80 | | | | |
| 1.00 | | | 0.00152 (Ohm) | 0.00099 (Ohm) |
| 1.20 | 0.00313 (Ohm) | 0.00284 (Ohm) | | 0.00199 (Ohm) |

TABLE 1-continued

Values of the effective resistance for a 0.15 nH inductor operating under various frequencies and depletion layer depths, wherein the spiral conductive layer of the inductor is made from an ideal lossless metal.
0.15 nH Inductor
An Ideal Metal

| Frequency (GHz) | Depth of Depletion Region (μm) | | | |
|---|---|---|---|---|
| | 0 | 6 | 12 | 18 |
| 1.40 | | 0.00601 (Ohm) | 0.00429 (Ohm) | 0.00332 (Ohm) |
| 1.60 | | 0.01051 (Ohm) | 0.00777 (Ohm) | 0.00559 (Ohm) |
| 1.80 | 0.02408 (Ohm) | | 0.01279 (Ohm) | 0.00950 (Ohm) |
| 2.00 | | 0.02288 (Ohm) | 0.01805 (Ohm) | 0.01371 (Ohm) |
| 2.20 | | 0.04019 (Ohm) | 0.02991 (Ohm) | 0.02200 (Ohm) |
| 2.40 | 0.07068 (Ohm) | 0.04907 (Ohm) | 0.03937 (Ohm) | 0.04019 (Ohm) |

TABLE 2

Values of the effective resistance for an inductor operating under various frequencies and depletion layer depths, wherein the spiral conductive layer of the inductor is made from aluminum with a thickness of 0.6 μm.
Aluminum/Thickness 0.6 μm

| Frequency (GHz) | Depth of Depletion Region (μm) | | | |
|---|---|---|---|---|
| | 0 | 6 | 12 | 18 |
| 0.80 | 0.33831 (Ohm) | 0.33730 (Ohm) | 0.33601 (Ohm) | 0.33856 (Ohm) |
| 1.00 | 0.35635 (Ohm) | 0.35359 (Ohm) | 0.36050 (Ohm) | 0.35017 (Ohm) |
| 1.20 | 0.37694 (Ohm) | 0.37592 (Ohm) | 0.39884 (Ohm) | 0.37263 (Ohm) |
| 1.40 | 0.41130 (Ohm) | 0.41053 (Ohm) | 0.40477 (Ohm) | 0.40149 (Ohm) |
| 1.60 | 0.45415 (Ohm) | 0.44829 (Ohm) | 0.44470 (Ohm) | 0.43907 (Ohm) |
| 1.80 | 0.51341 (Ohm) | 0.50526 (Ohm) | 0.50217 (Ohm) | 0.49009 (Ohm) |
| 2.00 | 0.59576 (Ohm) | 0.56801 (Ohm) | 0.55596 (Ohm) | 0.55019 (Ohm) |
| 2.20 | 0.69877 (Ohm) | 0.66499 (Ohm) | 0.65083 (Ohm) | 0.63516 (Ohm) |
| 2.40 | 0.84768 (Ohm) | 0.79094 (Ohm) | 0.76499 (Ohm) | 0.74907 (Ohm) |

TABLE 3

Values of the effective resistance for an inductor operating under various frequencies and depletion layer depths, wherein the spiral conductive layer of the inductor is made from copper with a thickness of 1.0 μm.
Copper/Thickness 1.0 μm

| Frequency (GHz) | Depth of Depletion Region (μm) | | | |
|---|---|---|---|---|
| | 0 | 6 | 12 | 18 |
| 0.80 | 0.15666 (Ohm) | 0.15765 (Ohm) | 0.15685 (Ohm) | 0.15775 (Ohm) |
| 1.00 | 0.16536 (Ohm) | 0.16698 (Ohm) | 0.16995 (Ohm) | 0.16489 (Ohm) |
| 1.20 | 0.18074 (Ohm) | 0.18015 (Ohm) | 0.22573 (Ohm) | 0.17710 (Ohm) |
| 1.40 | 0.20117 (Ohm) | 0.20204 (Ohm) | 0.19686 (Ohm) | 0.19399 (Ohm) |
| 1.60 | 0.23744 (Ohm) | 0.22319 (Ohm) | 0.21961 (Ohm) | 0.21560 (Ohm) |

TABLE 3-continued

Values of the effective resistance for an inductor
operating under various frequencies and depletion layer
depths, wherein the spiral conductive layer of the
inductor is made from copper with a thickness of 1.0 μm.
Copper/Thickness 1.0 μm

| Frequency (GHz) | Depth of Depletion Region (μm) | | | |
|---|---|---|---|---|
| | 0 | 6 | 12 | 18 |
| 1.80 | 0.25898 (Ohm) | 0.25778 (Ohm) | 0.25233 (Ohm) | 0.24473 (Ohm) |
| 2.00 | 0.30700 (Ohm) | 0.29425 (Ohm) | 0.28405 (Ohm) | 0.27862 (Ohm) |
| 2.20 | 0.37467 (Ohm) | 0.35231 (Ohm) | 0.34243 (Ohm) | 0.32657 (Ohm) |
| 2.40 | 0.46110 (Ohm) | 0.42882 (Ohm) | 0.40530 (Ohm) | 0.39166 (Ohm) |

TABLE 4

Values of the effective resistance for an inductor
operating under various frequencies and depletion layer
depths, wherein the spiral conductive layer of the
inductor is made from copper with a thickness of 2.0 μm.
Copper/Thickness 2.0 μm

| Frequency (GHz) | Depth of Depletion Region (μm) | | | |
|---|---|---|---|---|
| | 0 | 6 | 12 | 18 |
| 0.80 | 0.10146 (Ohm) | 0.10443 (Ohm) | 0.10161 (Ohm) | 0.10211 (Ohm) |
| 1.00 | 0.10813 (Ohm) | 0.11373 (Ohm) | 0.11152 (Ohm) | 0.10812 (Ohm) |
| 1.20 | 0.12065 (Ohm) | 0.13037 (Ohm) | 0.17716 (Ohm) | 0.11760 (Ohm) |
| 1.40 | 0.13715 (Ohm) | 0.14694 (Ohm) | 0.13315 (Ohm) | 0.13022 (Ohm) |
| 1.60 | 0.16580 (Ohm) | 0.16648 (Ohm) | 0.14956 (Ohm) | 0.14606 (Ohm) |
| 1.80 | 0.18206 (Ohm) | 0.19540 (Ohm) | 0.17550 (Ohm) | 0.16821 (Ohm) |
| 2.00 | 0.22472 (Ohm) | 0.23686 (Ohm) | 0.19833 (Ohm) | 0.19302 (Ohm) |
| 2.20 | 0.28832 (Ohm) | 0.28160 (Ohm) | 0.24549 (Ohm) | 0.22853 (Ohm) |
| 2.40 | 0.34452 (Ohm) | 0.35207 (Ohm) | 0.29049 (Ohm) | 0.27703 (Ohm) |

Figure 2A:
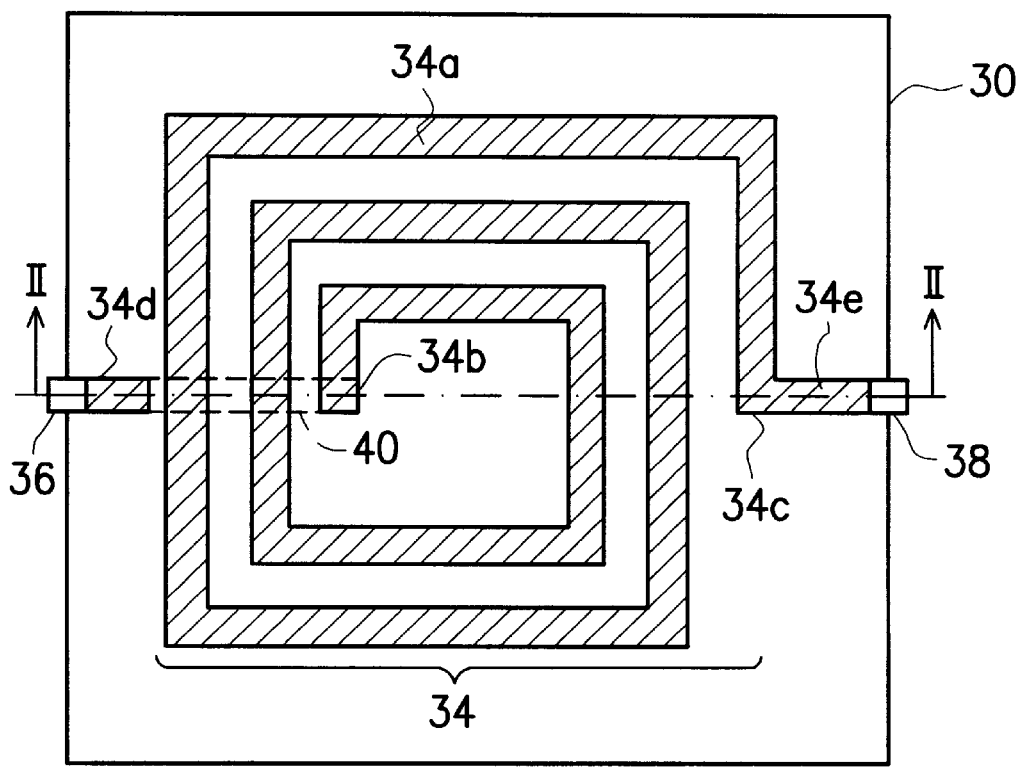
FIG. 2A is a schematic, top view showing an inductor according to a second embodiment of this invention.
Figure 2B:
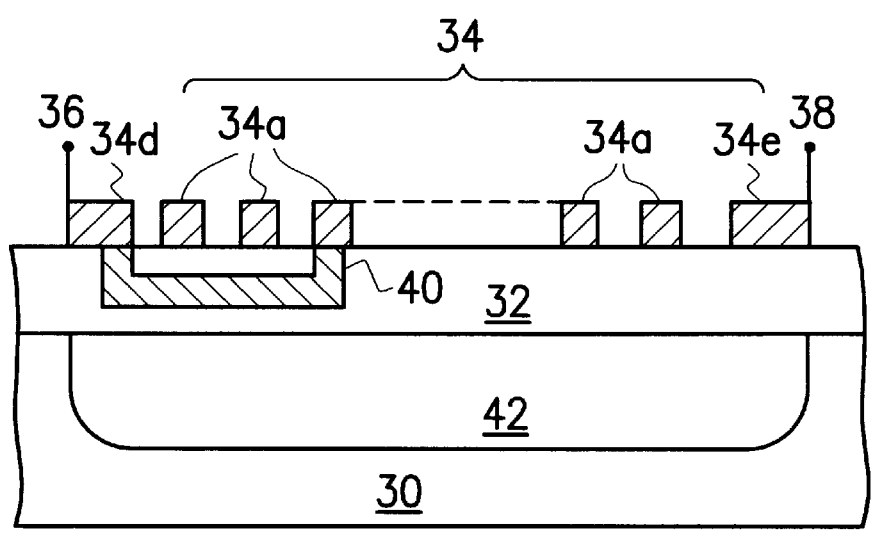
FIG. 2B is a schematic, cross-sectional view along line II—II in FIG. 2A.

FIG. 2A is a schematic, top view showing an inductor according to a second embodiment of this invention. FIG. 2B is a schematic, cross-sectional view along line II—II in FIG. 2A. As shown in FIGS. 2A and 2B, a substrate 30 such as a p-type silicon substrate is provided. An insulation layer 32, preferably a silicon dioxide layer, is formed over the substrate 30. A spiral conductive layer 34, made of aluminum or copper material, is formed over the insulation layer 32. The spiral conductive layer 34 further includes multiple spiral turns forming a spiral structure 34a having a first end 34b and a second end 34c. The first end 34b of the spiral structure 34a is connected to an input terminal 36 via a lower conductive layer 40 and a lead part 34d. The second end 34c is connected to an output terminal 38 via another lead part 34e. Alternatively, the first end 34b is connected to the output terminal 38, and the first end 34c is connected to the input terminal 36. The lower conductive layer 40 is formed within the insulation layer 32.

As shown in FIG. 2B, a doped layer 42 such as a P+ doped region is formed in the substrate under the exposed substrate surface below the spiral conductive layer 34 by an ion implantation. The conductive type of the doped layer 42 is identical to the silicon substrate 30, but doping concentration in the doped region 42 is higher than that in the silicon substrate 30. The doped layer 42 preferably has a doping concentration of about $5 \times 10^{19}$ atoms/cm$^3$ and a depth of a few micrometers. The object of having a doped layer 42 is to isolate the spiral inductor 34 from the silicon substrate 30 so that induced current in the substrate 30 and hence the amount of energy wasted in operation is reduced. For example, if the doped layer 42 has a depth about 2.0 μm, effective resistance Reff is roughly equivalent to having a depletion layer of thickness 6.0 μm in the first embodiment.

TABLE 5

Values of the effective resistance for a 0.15 nH inductor
operating under various frequencies and depletion layer
depths, wherein the spiral conductive layer of the
inductor is made from copper with a thickness of 2.0 μm.
0.15 nH inductor
Copper/Thickness 2.0 m

| Frequency (GHz) | Depth of doped layer 2.0 m Transinductance 5e4S/m |
|---|---|
| 0.80 | 0.10443 (Ohm) |
| 1.00 | 0.11373 (Ohm) |
| 1.20 | 0.13037 (Ohm) |
| 1.40 | 0.14694 (Ohm) |
| 1.60 | 0.16648 (Ohm) |
| 1.80 | 0.19540 (Ohm) |
| 2.00 | 0.23686 (Ohm) |
| 2.20 | 0.28160 (Ohm) |
| 2.40 | 0.35207 (Ohm) |

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing an inductor capable of reducing energy loss through an underlying substrate, comprising the steps of:

providing a substrate of a first conductive type;

forming a spiral conductive layer over the substrate, wherein the spiral conductive layer has a plurality of spiral turns with a first end and a second end such that the first end is connected to an input terminal while the second end is connected to an output terminal;

forming a doped region of a second conductive type in the substrate under substantially the whole spiral conductive layer;

forming a doped region of the first conductive type in the substrate, wherein the doped region of the first conductive type surrounds the doped region of the second conductive type but is separated from the doped region of the second conductive type by a distance; and supplying a reverse bias between the doped region of the first conductive type and the doped region of the second conductive type to form a depletion region under the doped region of the second conductive type and in a space between the doped region of the first conductive type and the doped region of the second conductive type, wherein the reverse bias is not applied to the spiral conductive layer.

2. The method of claim 1, wherein the substrate includes a silicon substrate.

3. The method of claim 1, wherein before the step of forming the spiral conductive layer over the substrate, further includes depositing insulation material over the substrate to form an insulation layer, whereby the conductive spiral layer is formed over the substrate on the insulation layer.

4. The method of claim 3, wherein the step of forming the insulation layer include depositing silicon dioxide.

5. The method of claim 1, wherein the spiral conductive layer is formed using aluminum.

6. The method of claim 1, wherein the spiral conductive layer is formed using copper.

7. The method of claim 1, wherein the depletion layer under the doped region of the second conductive type has a depth of between 0.5 to 18 $\mu$m.

8. The method of claim 1, wherein the first conductive type substrate is a $P^-$ substrate, the doped region of the second conductive type is a $N^+$ region and the doped region of the first conductive type is a $P^+$ region.

9. The method of claim 1, wherein the doped region of the second type forms a sheet-like structure in the substrate.

10. The method of claim 1, wherein the doped region of the first type forms a ring-like structure in the substrate around the doped region of the second conductive type.

* * * * *